US012802921B2

(12) United States Patent
Ichihashi et al.

(10) Patent No.: US 12,802,921 B2
(45) Date of Patent: Nov. 17, 2026

(54) ENVIRONMENTAL CELL AND ELECTRON MICROSCOPE

(71) Applicant: Hitachi, Ltd., Tokyo (JP)

(72) Inventors: Fumiaki Ichihashi, Tokyo (JP); Toshiaki Tanigaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 339 days.

(21) Appl. No.: 18/765,493

(22) Filed: Jul. 8, 2024

(65) Prior Publication Data

US 2025/0022678 A1 Jan. 16, 2025

(30) Foreign Application Priority Data

Jul. 13, 2023 (JP) ................................ 2023-114800

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2003* (2013.01); *H01J 2237/2007* (2013.01)

(58) Field of Classification Search
CPC .... H01J 37/20; H01J 37/26; H01J 2237/2003; H01J 2237/2007; H01J 2237/2004; H01J 2237/2614; H01J 2237/2802
See application file for complete search history.

(56) References Cited

U.S. PATENT DOCUMENTS

| | | | | |
|---|---|---|---|---|
| 8,872,129 B2 * | 10/2014 | Damiano, Jr. | ........ | H01J 37/261 250/311 |
| 9,070,532 B2 * | 6/2015 | Sugawara | ............... | H01J 37/20 |
| 10,872,743 B2 * | 12/2020 | Sugawara | ............... | G03H 5/00 |
| 2010/0193398 A1 * | 8/2010 | Marsh | ..................... | H01J 37/20 29/428 |

(Continued)

FOREIGN PATENT DOCUMENTS

| | | | | |
|---|---|---|---|---|
| DE | 112012001306 T5 * | 1/2014 | ............. | H01J 37/26 |
| EP | 2541583 A1 * | 1/2013 | ............. | H01J 37/26 |

(Continued)

*Primary Examiner* — David A Vanore
(74) *Attorney, Agent, or Firm* — Miles & Stockbridge, P.C.

(57) ABSTRACT

In liquid environment observation or gas environment observation using an environmental cell, highly accurate measurement is possible without being affected by deflection of a membrane. A environmental cell for holding a sample to be observed by an electron microscope includes: a first chip including a first membrane and a frame supporting the first membrane and having a first opening portion; a second chip including a second membrane and a frame supporting the second membrane and having a second opening portion; and a sample holding member. The first chip and the second chip are disposed such that the first membrane and the second membrane face each other and the first opening portion and the second opening portion overlap each other in a top view. The sample holding member is disposed on the second membrane in a manner of straddling a contour of the second opening portion in the top view. The sample is attached to a region located in the second opening portion in the top view of the sample holding member.

9 Claims, 9 Drawing Sheets

(56) References Cited

U.S. PATENT DOCUMENTS

| | | | | |
|---|---|---|---|---|
| 2014/0117232 | A1* | 5/2014 | Shachal | H01J 37/244 250/307 |
| 2014/0268321 | A1* | 9/2014 | Damiano, Jr. | H01J 37/20 356/244 |
| 2016/0245732 | A1* | 8/2016 | Rémigy | H01J 37/26 |
| 2017/0213692 | A1* | 7/2017 | Yu | G01N 23/02 |
| 2021/0249219 | A1* | 8/2021 | Woehl | H01J 37/20 |
| 2022/0044906 | A1* | 2/2022 | Nakamura | H01J 37/265 |
| 2024/0404781 | A1* | 12/2024 | Tanigaki | H01J 37/20 |
| 2025/0022678 | A1* | 1/2025 | Ichihashi | H01J 37/26 |

FOREIGN PATENT DOCUMENTS

| | | | | | |
|---|---|---|---|---|---|
| EP | 4141429 | A1 | * | 3/2023 | G01N 23/20025 |
| EP | 4481790 | A2 | * | 12/2024 | H01J 37/261 |
| JP | 2022067698 | A | * | 5/2022 | |
| JP | 2023-012394 | A | | 1/2023 | |
| JP | 2025012169 | A | * | 1/2025 | H01J 37/20 |
| KR | 20240015405 | A | * | 2/2024 | H01J 37/20 |
| WO | WO-2010092747 | A1 | * | 8/2010 | H01J 37/20 |
| WO | WO-2012018827 | A2 | * | 2/2012 | H01J 37/26 |
| WO | WO-2017203553 | A1 | * | 11/2017 | H01J 37/26 |
| WO | WO-2018191167 | A1 | * | 10/2018 | H01J 37/20 |
| WO | WO-2025021689 | A1 | * | 1/2025 | H01J 37/26 |

* cited by examiner

ENVIRONMENTAL CELL AND ELECTRON MICROSCOPE

CROSS-REFERENCE TO RELATED APPLICATION

This application claims priority to Japanese Patent Application No. 2023-114800 filed on Jul. 13, 2023, the entire contents of which are incorporated by reference herein.

BACKGROUND OF THE INVENTION

1. Field of the Invention

The present invention relates to an environmental cell that holds a sample to be observed with an electron microscope in a gas or liquid, and the electron microscope on which the environmental cell can be mounted.

2. Description of Related Art

As one of the electron microscope observation needs for an environmental field, for example, there is catalyst observation in a liquid environment or a gas environment using an environmental cell. A environmental cell as shown in FIG. 1 is often used for observation in the liquid environment or the gas environment. The environmental cell shown in FIG. 1 is formed by combining two silicon chips (hereinafter, Si chips) 1 and 5. The upper Si chip 1 and the lower Si chip 5 have the same basic configuration, and each includes a membrane 3 (7) and a frame 2 (6) supporting the membrane. An opening portion 4 (8) is formed in the frame 2 (6). A thickness of the frame is about 200 μm. A spacer 9 for forming a space for sealing a sample is formed in the lower Si chip 5. For example, the frame 2 (6) is made of single crystal Si, the membrane 3 (7) is made of a SiN thin film, and the spacer 9 is made of a metal such as gold (Au). Therefore, the Si chip can be manufactured using a semi-conductor processing technique. However, the Si chip is not limited to these materials. Further, when the Si chip is replaced with a MEMS chip in which a heater for heating the sample or an electrode for applying an electric field to the sample formed on the membrane, it is possible to more variously control an environment of the sample to be observed.

A sample 71 is sealed in a space sandwich between the membrane 3 and the membrane 7, and an environment of the space in which the sample 71 is controlled from a sample holder (not shown). In this state, an electron beam 53 is emitted, and the sample 71 is observed. A problem of this observation method is that electron beam scattering occurs when the electron beam 53 passes through the membranes 3 and 7, and therefore, an image quality deteriorates in an observation image of the sample 71.

In PTL 1, a region required to have a minimum limit for observation of a sample, minute holes through which an electron beam can pass are provided in a membrane, and a sample supporting film for supporting the sample is provided at a position between upper and lower membranes to support the sample. By using a thin carbon film or a mesh microgrid having opening holes as the sample supporting film, an observation result of an optical quality of the sample can be obtained in a state in which a pattern of the supporting film is hardly superimposed on the sample or is not superimposed on the sample at all.

CITATION LIST

Patent Literature

PTL 1: JP2023-12394A

SUMMARY OF THE INVENTION

A environmental cell according to an embodiment of the invention is an environmental cell for holding a sample to be observed by an electron microscope. The environmental cell includes: a first chip including a first membrane and a frame supporting the first membrane and having a first opening portion; a second chip including a second membrane and a frame supporting the second membrane and having a second opening portion; and a sample holding member. The first chip and the second chip are disposed such that the first membrane and the second membrane face each other and the first opening portion and the second opening portion overlap each other in a top view. The sample holding member is disposed on the second membrane in a manner of straddling a contour of the second opening portion in the top view. The sample is attached to a region located in the second opening portion in the top view of the sample holding member.

In liquid environment observation or gas environment observation using the environmental cell, highly accurate measurement is possible without being affected by deflection of the membranes. Other problems and novel features will become apparent from description of this description and the accompanying drawings.

DESCRIPTION OF EMBODIMENTS

Figure 1:
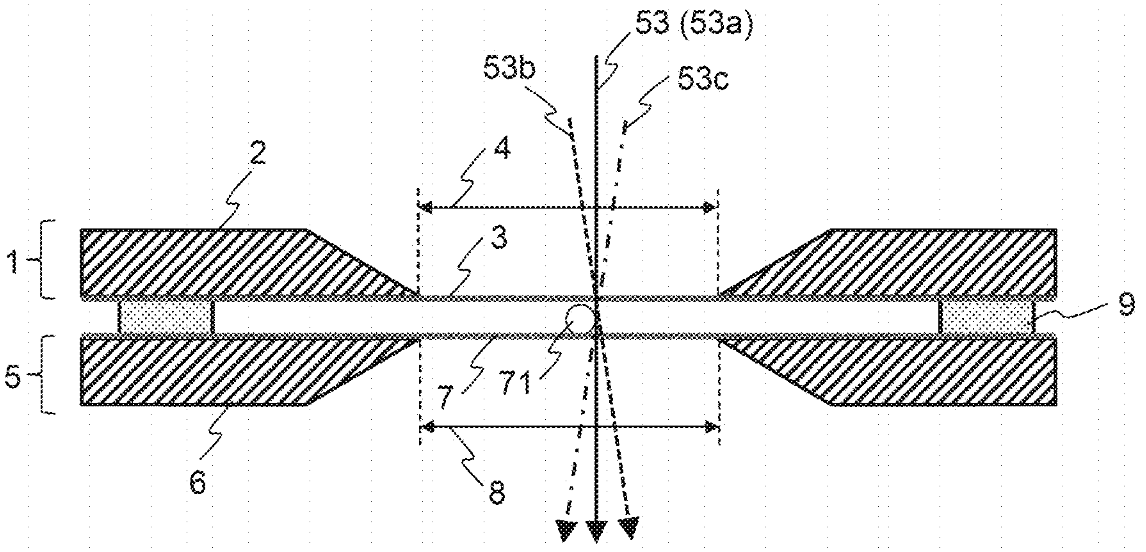
FIG. 1 is a membrane showing a problem of the invention.
Figure 2:
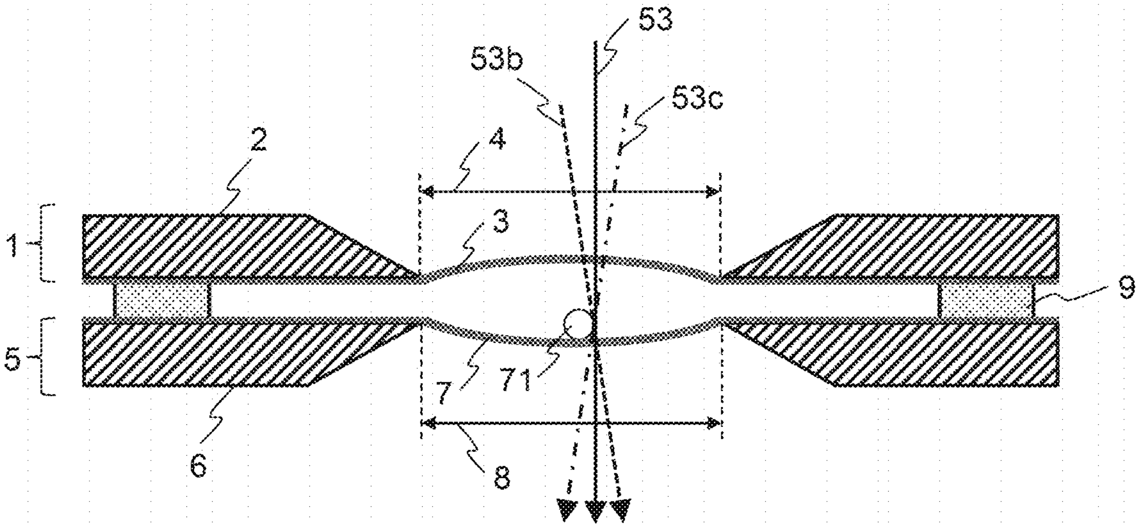
FIG. 2 is a membrane showing a problem of the invention.

Hereinafter, embodiments according to the invention will be described with reference to the drawings. However, the invention is not to be construed as being limited to the description of the following embodiments. It will be easily understood by those skilled in the art that the specific configuration can be changed without departing from the spirit or scope of the invention. In a configuration of the invention described below, the same parts or parts having the same functions are denoted by the same reference numerals in different drawings, and redundant description thereof may be omitted.

Figure 9:
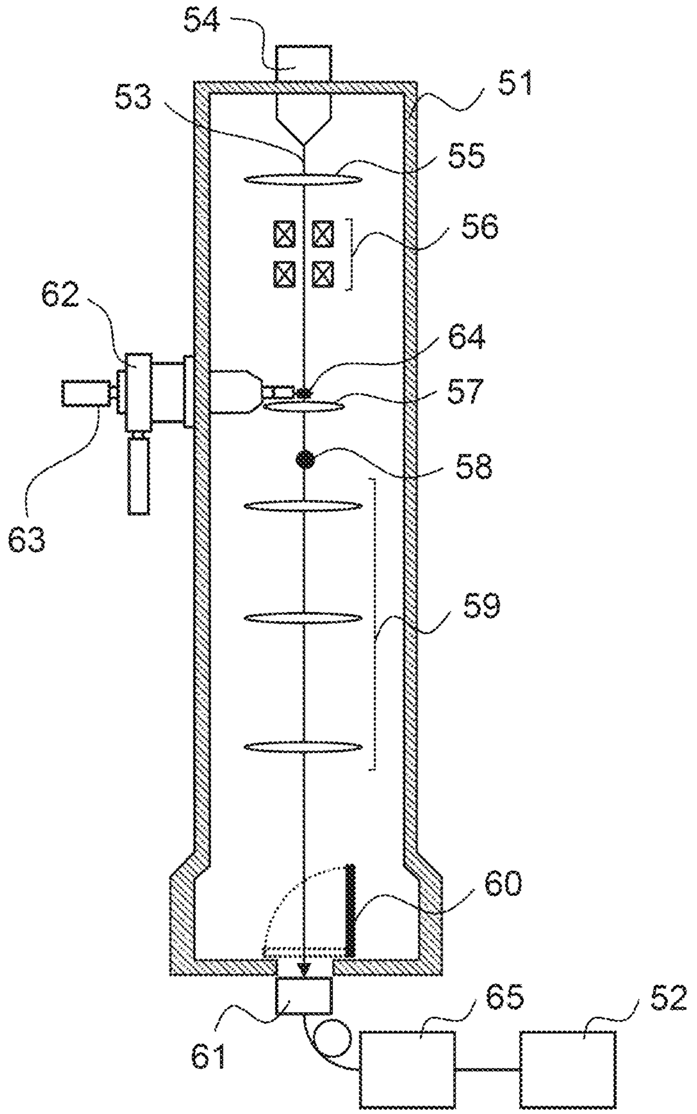
FIG. 9 is a schematic view of a microscope system.

FIG. 9 is a schematic diagram of a microscope system. As shown in FIG. 9, the microscope system includes a transmission electron microscope 51 and a control device (analysis PC) 52.

First, a configuration of the transmission electron microscope 51 will be described. The transmission electron microscope 51 includes an electron source 54, a condenser lens 55, deflectors 56, an objective lens 57, an electron biprism 58, a projection lens system 59, a fluorescent plate 60, a camera (imaging unit) 61, a goniometer 62, and a control PC 65.

The electron source 54 includes a cathode for emitting the electron beam 53 and an accelerating tube for accelerating the electron beam 53. The condenser lens 55 focuses the electron beam 53 emitted and accelerated by the electron source 54. The deflectors 56 deflect the electron beam 53 focused by the condenser lens 55 and adjusts an incident angle to an environmental cell 64. The objective lens 57 is a lens for adjusting a spot diameter of the electron beam 53 emitted to the sample 71, and includes an upper magnetic pole piece disposed upstream of the electron beam 53 and a lower magnetic pole piece disposed downstream of the electron beam 53. The electron biprism 58 forms an electron beam interference fringe (hologram) by superimposing an electron wave passing through the sample 71 to be observed and a reference electron wave path through a vacuum. The projection lens system 59 includes a plurality of lenses for enlarging the hologram and projecting an image. The fluorescent plate 60 is a plate that emits fluorescence by the electron beam 53 imaged by the projection lens system 59. The camera 61 acquires a hologram image obtained by the projection lens system 59 when the fluorescent plate 60 is opened.

The goniometer 62 adjusts a position of a sample holder 63 to be mounted. When the sample holder 63 is attached to the goniometer 62, the environmental cell 64 provided at a tip end of the sample holder 63 is located between the upper magnetic pole piece and the lower magnetic pole piece of the objective lens 57. A structure of the environmental cell 64 will be described later.

The control PC 65 controls the electron source 54, the condenser lens 55, the deflectors 56, the objective lens 57, the electron biprism 58, the projection lens system 59, the camera 61, and the goniometer 62, and stores the hologram image acquired by the camera 61 in a storage unit (not shown). A display device (not shown) is connected to the control PC 65, and can display control contents of the control PC 65, the hologram image acquired by the camera 61, or the like.

In the transmission electron microscope 51, the electron beam 53 emitted from the electron source 54 passes through the condenser lens 55 and the upper magnetic pole piece of the objective lens 57, and is emitted to the environmental cell 64. The electron beam 53 transmitted through the environmental cell 64 passes through the lower magnetic pole piece of the objective lens 57 and the projection lens system 59 including a plurality of lenses. When the fluorescent plate 60 is opened, electron wave information acquired by the camera 61 is displayed on the display device of the control PC 65. Since the electron biprism 58 is provided between the environmental cell 64 and the projection lens system 59 in the transmission electron microscope 51, it is possible to perform electron holography observation capable of acquiring phase information of the electron wave.

The number of electron biprisms 58 is not particularly limited, and may be two. Further, as long as the phase information of the electron wave can be acquired, a method other than the electron holography, or another charged particle device such as a scanning transmission electron microscope or a scanning electron microscope may be used.

The control device 52 changes a focal position of a plurality of pieces of electron wave information (for example, hologram images) stored in the storage unit of the control PC 65 to the lower membrane 7, and calculates an amplitude and a phase of the electron wave derived from the upper membrane 3, the sample 71, and the lower membrane 7 based on an amplitude and a phase included in electron wave information after the change of the focal position. Exchange of data between the control PC 65 and the control device 52 of the transmission electron microscope 51 may be performed via a dedicated communication line or network, or may be performed via a recording medium.

Embodiment 1

Figure 3:
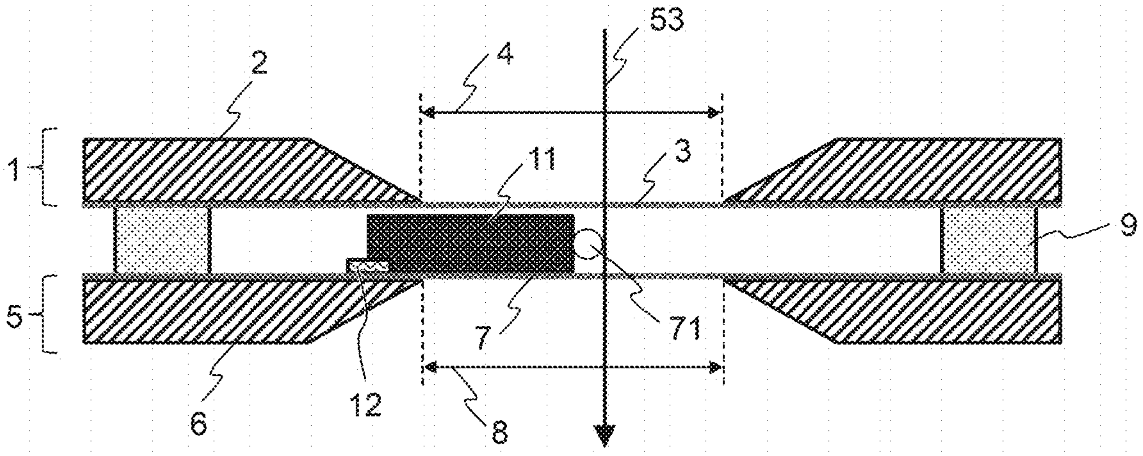
FIG. 3 is a cross-sectional view of an environmental cell provided with a sample holding member according to Embodiment 1.
Figure 4:
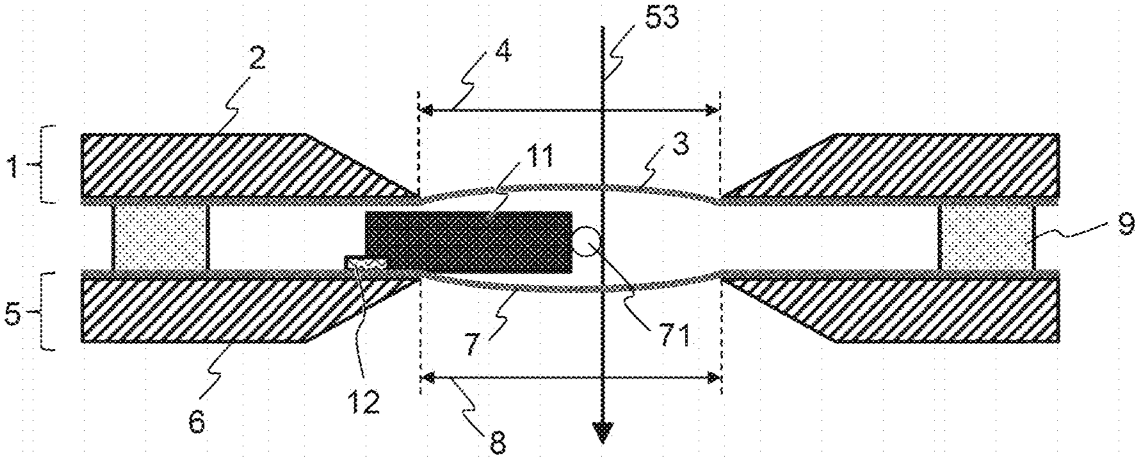
FIG. 4 is a cross-sectional view of the environmental cell provided with the sample holding member according to Embodiment 1.

A environmental cell provided with a sample holding member will be described in Embodiment 1 with reference to FIGS. 3 to 5. Here, an example in which a sample holding member 11 is disposed on the lower Si chip 5 is shown, but the sample holding member 11 may be disposed on the upper Si chip 1. FIGS. 3 and 4 are cross-sectional views of the environmental cell provided with the sample holding member 11, and FIG. 5 is a bird's-eye view of the lower Si chip 5 on which the sample holding member 11 is disposed.

The sample holding member 11 has a surface (referred to as a "side surface") perpendicular to a surface (referred to as a "bottom surface") in contact with the membrane. The sample 71 is dispersed and attached to the side surface. Here, as the sample 71, an example of a μm-sized spherical carrier, on which fine particles (nanoparticles) having catalytic activity such as a noble metal and ceramics are supported, is shown, but fine particles themselves may be used. A material of the sample holding member 11 is, for example, Si, and the sample 71 is attached to the side surface of the sample holding member 11 due to an electrostatic force. The bottom surface of the sample holding member 11 is disposed in a manner of straddling a contour of the opening portion 8 of the frame 6 in a top view, and the side surface of the sample holding member 11 is located in the opening portion 8 of the frame 6 in the top view. The sample holding member 11 is fixed on the membrane 7 by a fixture 12. The fixture 12 can be formed by vapor deposition of tungsten, carbon, or the like.

An overall shape of the sample holding member 11 is not particularly limited. For example, a depth of the sample holding member 11 (a length of a side where the bottom surface and the side surface intersect) may be shorter (the example of FIG. 5) or longer than a length of one side of the opening portion 8 of the frame 6. However, the sample holding member 11 is located between the two Si chips 1 and 5, and receives a pressure from above and below in order to seal the space sandwiched between the membrane 3 and the membrane 7. Therefore, when a thickness h1 of the sample holding member 11 is larger than a thickness h2 of the spacer 9, the Si chip or the membrane may be damaged when the environmental cell 64 is fixed to the sample holder 63. Accordingly, the thickness h1 of the sample holding member 11 needs to be smaller than the thickness h2 of the spacer 9.

Figure 5:
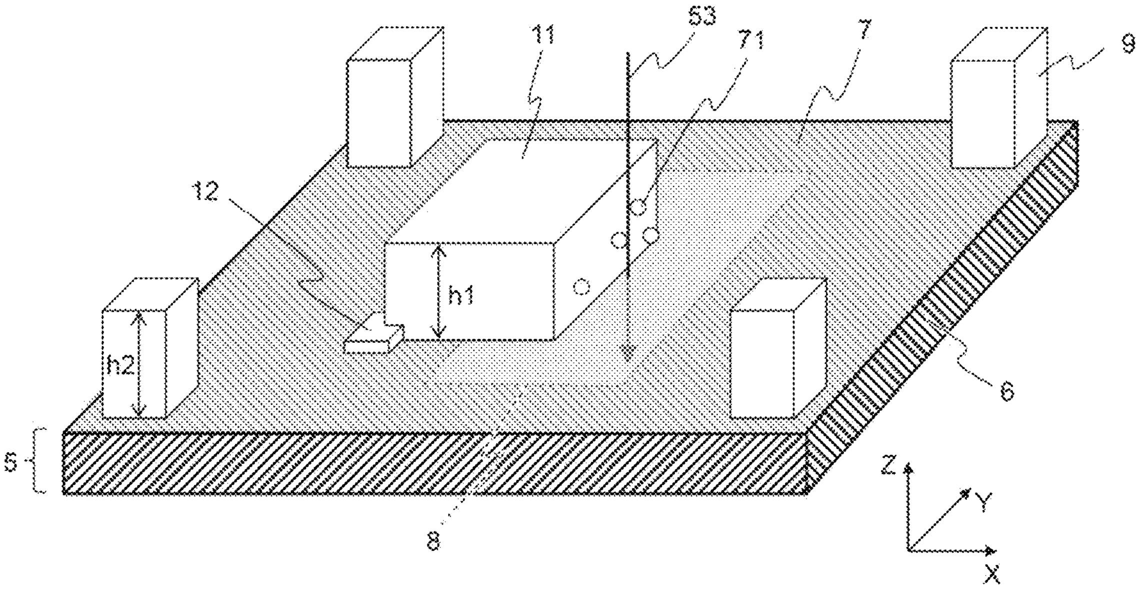
FIG. 5 is a bird's-eye view of a lower Si chip provided with the sample holding member according to Embodiment 1.

The structure shown in FIG. 5 can be formed using, for example, a focused ion beam (FIB) device. First, a Si substrate is carried into an FIB device, and the sample holding member 11 is formed by cutting out the Si substrate into an appropriate size. The cut-out sample holding member 11 is placed on the membrane 7 of the Si chip 5, and a film serving as the fixture 12 can be formed by emitting the focused ion beam while locally spraying an organic gas called a tungsten compound or a carbon compound to a formation position of the fixture 12. It is desirable to attach the sample 71 before the Si substrate is cut out. In this case, the sample holding member 11 in a state where the sample 71 is already attached to the side surface can be disposed on the lower Si chip 5, and the risk of the sample 71 being scattered on the membrane 7 can be reduced. Of course, after the sample holding member 11 is fixed to the lower Si chip 5, the sample 71 may be attached to the side surface thereof.

Here, as shown in a coordinate axis of FIG. 5, a direction in which an optical axis of the electron beam of the transmission electron microscope 51 extends is defined as a Z direction, a plane perpendicular to the Z direction is defined as an XY plane, and a direction in which an intersection line between the bottom surface and the side surface of the sample holding member 11 extends is defined as a Y direction. At this time, when the optical axis of the electron beam of the transmission electron microscope 51 is inclined in the YZ plane to irradiate the sample 71 with the electron beam, the sample holding member 11 can be prevented from being included in a path of the electron beam transmitted through the sample 71.

By placing the upper Si chip 1 on the lower Si chip 5 shown in FIG. 5 and fixing the upper Si chip 1 by the sample holder 63, the space sandwiched between the membrane 3 and the membrane 7 is isolated from a vacuum atmosphere inside the transmission electron microscope 51. When a liquid or a gas is introduced into the space sandwiched between the membrane 3 and the membrane 7, the upper membrane 3 and the lower membrane 7 expand outward as shown in FIG. 4. However, since the sample holding member 11 is independent of the membranes, a position of the sample holding member 11 does not change, and the sample position can be held near a center of the environmental cell.

Embodiment 2

In contrast to the environmental cell according to Embodiment 1, an environmental cell provided with a sample holding member, in which a degree of freedom of an irradiation direction of the electron beam to the sample 71 is further increased, will be described in Embodiment 2. In the following description, differences from Embodiment 1 will be mainly described, and redundant description will be omitted.

The sample 71 needs to be attached to a region located in the opening portion 8 in a top view of the sample holding member. However, in the sample holding member 11 according to Embodiment 1, when the electron beam is inclined in a direction intersecting the YZ plane, the sample holding member 11 is included in the path of the electron beam transmitted through the sample 71, which causes a decrease in the image quality. In a sample holding member 13 according to Embodiment 2, a thickness of a surface to which the sample 71 is attached is reduced. Specifically, the sample holding member 13 shown in FIG. 6 includes a planar protrusion portion 14 protruding in an X direction from a side surface thereof, and the sample 71 is attached to a top portion of the protrusion portion 14.

Figure 7:
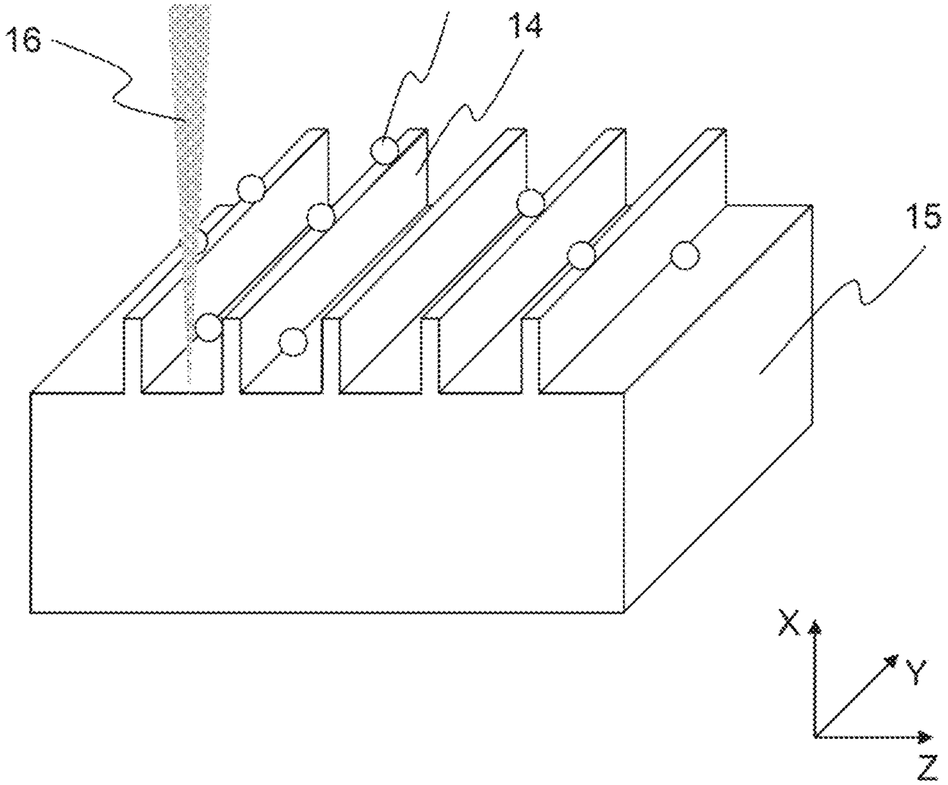
FIG. 7 is a diagram showing a method of manufacturing the sample holding member.

A method of manufacturing the sample holding member 13 will be described. The sample holding member 13 is formed by cutting out a Si substrate 15 having a comb-shaped structure shown in FIG. 7, so that the sample holding member 13 includes one protrusion portion 14. FIG. 7 shows a state in which cutting is performed after the sample 71 is attached to the Si substrate 15, and shows a state in which a groove portion of the comb-shaped structure is irradiated with a focused ion beam 16. In Embodiment 2, the sample 71 may be attached after the sample holding member 13 is fixed to the Si chip.

Figure 6:
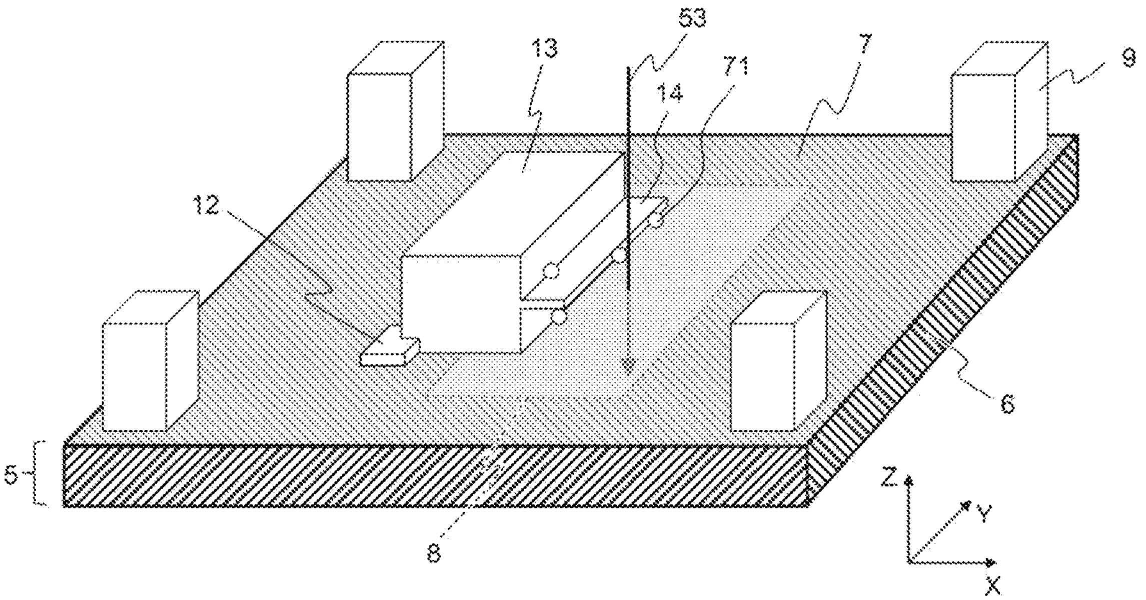
FIG. 6 is a bird's-eye view of a lower Si chip provided with a sample holding member according to Embodiment 2.

An overall shape of the sample holding member 11 is not particularly limited. For example, in the example of FIG. 6, an example in which the protrusion portion 14 is provided on the side surface is shown, but a surface intersecting with the bottom surface at a predetermined angle may be formed, and the protrusion portion 14 may be provided on the surface to protrude in parallel to the bottom surface. In the example of FIG. 6, a bottom surface of the sample holding member 13 is disposed in a manner of straddling the contour of the opening portion 8 of the frame 6 in the top view. However, the bottom surface may be disposed at a position other than the opening portion 8 of the frame 6 in the top view, and at least the top portion of the protrusion portion 14 may be located in the opening portion 8 in the top view. Further, a cross section of the protrusion portion 14 in an XZ plane is rectangular in the example of FIG. 7, but the cross-sectional shape is not particularly limited, and may be, for example, a wedge shape.

Embodiment 3

When the sample 71 is used as a catalyst, activity of the catalyst becomes high if an electric field is applied to the catalyst. A environmental cell capable of applying an electric field to the sample (catalyst) 71 will be described in Embodiment 3. Although FIG. 8 shows an example in which the sample holding member 11 according to Embodiment 1 is provided, the sample holding member 13 according to Embodiment 2 may be provided.

Figure 8:
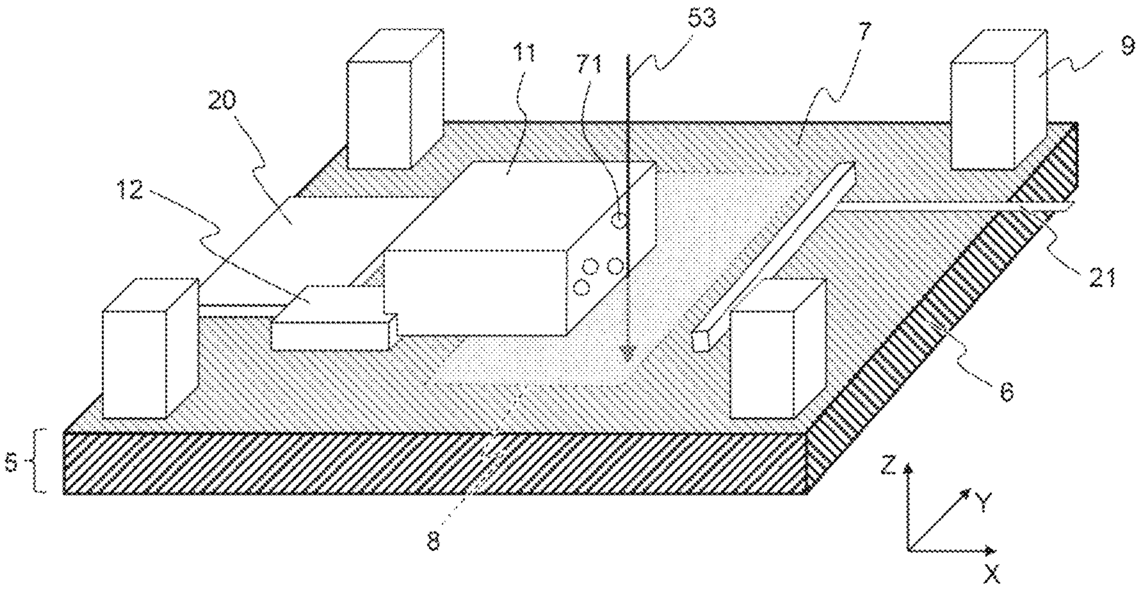
FIG. 8 is a bird's-eye view of a lower Si chip provided with a sample holding member according to Embodiment 3.

On the lower Si chip 5 shown in FIG. 8, a first electrode 20 and a second electrode 21 are provided on the membrane 7 to face each other with the opening portion 8 of the frame 6 sandwiched therebetween in the top view. Such a configuration can be easily implemented using a MEMS technology. As shown in FIG. 8, the fixture 12 is formed to be connected to both the first electrode 20 and the sample holding member 11. Accordingly, when a voltage is applied between the first electrode 20 and the second electrode 21 from the sample holder 63, an electric field is generated between the second electrode 21 and the sample holding member 11 to which the sample 71 is attached. Therefore, observation under a state in which the electric field is applied to the sample 71 becomes possible.

INDUSTRIAL APPLICABILITY

By putting the environmental cell and the electron microscope described above into practical use for observation with the electron microscope in a gas environment or a liquid environment, it is possible to measure an electromagnetic field during reaction in a catalyst or an electrode with high accuracy. From an observation function newly implemented by a new system using the invention, for example, a mechanism of the catalyst is clarified, and it is expected to contribute to development of a fuel cell and a $CO_2$ fuel conversion catalyst having high performance and high durability, which are required for implementing a carbon neutral society which is required in the world in the future.

What is claimed is:

1. A environmental cell for holding a sample to be observed by an electron microscope, the environmental cell comprising:

a first chip including a first membrane and a frame supporting the first membrane and having a first opening portion;

a second chip including a second membrane and a frame supporting the second membrane and having a second opening portion; and a sample holding member, wherein the first chip and the second chip are disposed such that the first membrane and the second membrane face each other and the first opening portion and the second opening portion overlap each other in a top view, the sample holding member is disposed on the second membrane in a manner of straddling a contour of the second opening portion in the top view, and the sample is attached to a region located in the second opening portion in the top view of the sample holding member.

2. The environmental cell according to claim 1, wherein the sample holding member has a bottom surface in contact with the second membrane and a side surface perpendicular to the bottom surface, the side surface is located in the second opening portion in the top view, and the sample is attached to the side surface of the sample holding member.

3. The environmental cell according to claim 1, wherein the sample holding member has a bottom surface in contact with the second membrane and a surface intersecting with the bottom surface at a predetermined angle, the surface includes a protrusion portion protruding in parallel with the bottom surface, and at least a top portion of the protrusion portion is located in the second opening portion in the top view, and the sample is attached to the top portion of the protrusion portion.

4. The environmental cell according to claim 3, wherein a cross-sectional shape of the protrusion portion is a rectangle shape or a wedge shape.

5. The environmental cell according to claim 1, wherein a distance between the first membrane and the second membrane is determined by a thickness of a spacer located between the first membrane and the second membrane, and a thickness of the sample holding member is smaller than the thickness of the spacer.

6. The environmental cell according to claim 1, further comprising:

a fixture configured to fix the sample holding member onto the second membrane.

7. The environmental cell according to claim 6, wherein the second chip includes a first electrode and a second electrode on the second membrane, the first electrode and the second electrode facing each other with the second opening portion sandwiched therebetween in the top view, and the fixture is connected to the first electrode and the sample holding member.

8. An electron microscope comprising:

an electron source;

a condenser lens configured to condense an electron beam from the electron source;

a deflector configured to deflect the electron beam;

an objective lens including an upper magnetic pole piece and a lower magnetic pole piece;

a sample holder configured to insert the environmental cell according to any one of claims 1 to 7 between the upper magnetic pole piece and the lower magnetic pole piece;

an electron biprism configured to superimpose an electron wave transmitted through the sample and a reference electron wave to form an electron beam interference fringe;

an projection lens system configured to enlarge the electron beam interference fringe and form an image; and an imaging unit configured to acquire the image of the electron beam interference fringe obtained by the projection lens system.

9. The electron microscope according to claim 8, wherein a direction in which the deflector deflects the electron beam is set to a direction in which the electron beam transmitted through the sample does not transmit through the sample holding member.

* * * * *